March 25, 1969 F. F. MAYTONE 3,434,455

APPARATUS FOR TINNING PRINTED CIRCUITRY

Filed Oct. 29, 1964

INVENTOR.
FRANK F. MAYTONE

BY Nicolaas de Vogel

AGENT 3,434,455
APPARATUS FOR TINNING PRINTED CIRCUITRY

Frank F. Maytone, Huntsville, Ala., assignor to The Boeing Company, Seattle, Wash., a corporation of Delaware Filed Oct. 29, 1964, Ser. No. 407,470
Int. Cl. B05c *11/00;* B23k *5/00*
U.S. Cl. 118—72 1 Claim

ABSTRACT OF THE DISCLOSURE

An apparatus for solder coating printed circuit boards comprising a plurality of wire mesh screen mounted to a planar surface of a heated base to form a reservoir for the retention of a molten solder within the interstices of the screens. As a circuit board is moved reciprocally over the outer screen surface, contaminants are removed from the circuit board and solder, wicked through the screen assembly, is coated onto the circuit board.

This invention relates to an apparatus for applying a solder coating onto a sheet of solderable material and more especially to tinning of printed circuitry.

In general, the present invention provides an easy and economical manner of placing a uniform protective solderable coating on at surfaces such as; sheet steel, copper clad and printed circuit boards without the use of complex machines and cleaning processes.

In the prior art, printed circuit boards have been coated with a protective layer by processes such as plating, flow coating and roller coating.

The plating process was usually done with a noble material such as gold which makes this process expensive and because of the porosity of gold not suited for long storage periods when printed circuits are involved.

Solder plating is porous and requires the use of acids which are difficult to remove. Platings, in general, are porous, require stringent process control, require time for cleaning, plating and recleaning, and present problems of acid contamination.

The process of flow coating with solder is expensive and troublesome, a circuit board should be thoroughly clean in order to remove oxides. Furthermore a flow coating machine is intricate and costly.

Roller coating with solder presents the same problems of thoroughly cleaning in order to remove oxides and thereby does not offer adequate protection, because of the very thin layer of solder coating that is applied to the printed circuit by this system.

The present invention provides an apparatus which allows placement of a uniform, protective solderable coating to flat objects without the disadvantages as mentioned in the prior art methods above.

It is therefore an object of the present invention to provide an apparatus for coating electronic printed circuit boards with a protective layer of solder in a one step operation.

It is another object of this invention to provide an apparatus adapted to coat flat objects with a uniform protective coating of solder without going through the normal necessary cleaning procedures and whereby the thickness of the coating can be controlled.

For a better understanding of the invention, together with other objects thereof, reference should now be made to the following detailed description which is to be read in conjunction with the accompanying drawings in which.

In general, the present apparatus provides a means of hot solder coating of printed circuitry and also any solderable sheet metal, which yields high quality coatings without use of acid flux and without the process control difficulties associated with wave solder machine coating.

Figure 1:
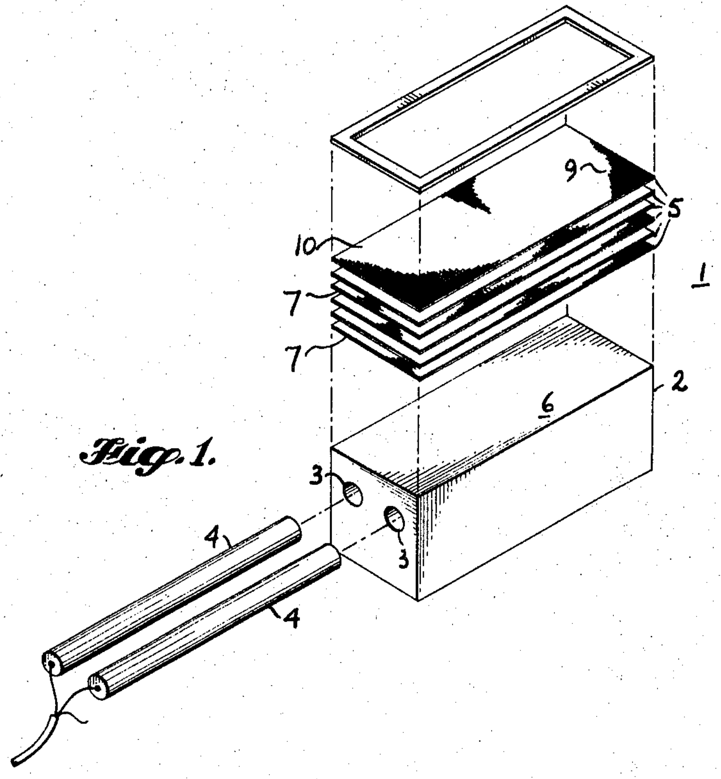
FIGURE 1 is an isometric exploded view of the solder coating apparatus.

Referring now to the drawings wherein like reference characters designate corresponding parts, there is shown in FIGURE 1 a disassembled solder coating apparatus 1 having a metal base 2 provided apertures 3 for the insertion of the heating elements 4. A plurality of screens 5 are aligned above the upper surface 6 of the metal base 2.

Figure 2:
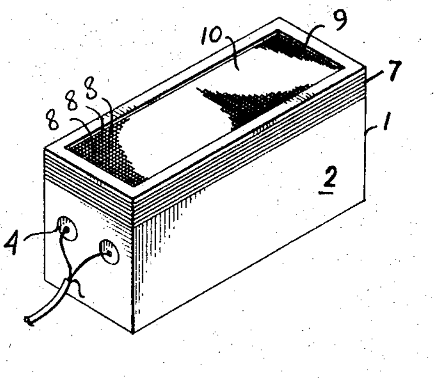
FIGURE 2 is an isometric view of the solder coating apparatus.

In FIGURE 2 the solder coating apparatus 1 is provided with a plurality of screens 5 fixedly mounted on its upper surface 6. The edges 7 of the screens 5 are mounted in a fluid tight relationship with one another and with the upper surface 6. The stainless steel screens 5 are provided with a fine screen mesh 9 which is wetted with solder 8 that is retained by capillary action in the screen mesh 9 and wicked unto the surface 10 of the upper screen 5.

Having thus described the several elements and their functions by reference characters the method and operation of the apparatus is as follows:

The heating elements 4 are connected to an electrical source (not shown) resulting in heating the fine mesh screen 9 which contains solder 8. The solder 8 becomes molten and in this condition will by capillary action load the fine mesh screens 5 with molten solder 8. Thus, the molten solder 8 is retained in the screen mesh 9 of the screens 5 and is wicked unto the surface of an object being coated as its surface is cleaned by flux and scrubbing action when brought in contact with the screen mesh 9. The solder temperature is thermostatically controlled.

The coating obtained completely covers and wets the surface of the object with a thin, evenly distributed, bright appearing film of solder which is easily solderable. The application is especially important for applying protective coatings to electronic circuit boards. A metal-clad printed circuit board to be solder coated is fluxed and placed uncleaned, against the screen mesh 9 of screen 5. The circuit board is moved across the surface 10 of the screen 5 with an oscillatory or reciprocal motion. This motion abrades and removes the contaminates on the surface of the printed circuit board and simultaneously coats the cleaned surface with clean molten solder. The thickness of the solder coating on a printed circuit board can be varied between .0005 to .009 inch and can be controlled by the rate of withdrawal of the printed circuit board on the screen mesh 9. A slower rate of withdrawal results in a thinner coating due to wicking of excess solder off of the board by the screen mesh 9.

The screen mesh 9 is of the type commonly used for the silk screen process of printed circuits manufacturing. In general, a 200 mesh stainless steel screen of about 4 to 6 layers of screen should be used.

It will be obvious that automation of this coating apparatus for printed circuits can easily be achieved for high speed production and manufacturing purposes through the connection therewith of conveyor operation systems.

I claim:

1. An apparatus for solder coating electrical circuit boards comprising:

(a) a base having an upper horizontal plane surface;

(b) a plurality of solder wettable screens of about 150–300 mesh in face to face contact, horizontally disposed, and fixedly mounted to said plane surface of said base with the lowermost of said screens in contact with said surface, said screens forming a reservoir for the containment of molten solder within the interstices of said screens and the outer layer of said screens being adapted to provide an abrading surface for cleaning an associated circuit board moved reciprocally thereon; and (c) heater means mounted in said base for maintaining the solder in a molten condition;

whereby the molten solder contained within said plurality of screens is by capillary action transported to the outer screen layer and coated upon the associated circuit board.

References Cited

UNITED STATES PATENTS

| | | | |
|---|---|---|---|
| 1,813,657 | 7/1931 | Boothman et al. | 29—502 |
| 2,087,716 | 7/1937 | Banscher | 29—497 |
| 2,530,026 | 11/1950 | Muench | 118—411 XR |
| 2,678,024 | 5/1954 | Kresse | 118—401 |
| 875,546 | 12/1907 | Metzner | 118—401 XR |
| 3,145,121 | 8/1964 | Kraft et al. | 118—202 |

ROBERT E. PULFREY, *Primary Examiner.*

C. D. CROWDER, *Assistant Examiner.*

U.S. Cl. X.R.

228—35